(12) United States Patent
Mandyam Krishnakumar et al.

(10) Patent No.: US 11,442,102 B2
(45) Date of Patent: Sep. 13, 2022

(54) TEST AND MEASUREMENT SYSTEM FOR PARALLEL WAVEFORM ANALYSIS

(71) Applicant: Tektronix, Inc., Beaverton, OR (US)

(72) Inventors: Sriram Mandyam Krishnakumar, Bengaluru (IN); Sunil Mahawar, Portland, OR (US); Mahesha Guttahalli Lakshmipathy, Bengaluru (IN); Satish Kumar Makanahalli Ramaiah, Bengaluru Rural District (IN)

(73) Assignee: Tektronix, Inc., Beaverton, OR (US)

( * ) Notice: Subject to any disclaimer, the term of this patent is extended or adjusted under 35 U.S.C. 154(b) by 305 days.

(21) Appl. No.: 16/870,990

(22) Filed: May 10, 2020

(65) Prior Publication Data
US 2020/0363471 A1    Nov. 19, 2020

(30) Foreign Application Priority Data

May 17, 2019    (IN) .............................. 201921019655

(51) Int. Cl.
*G01R 31/317*    (2006.01)
(52) U.S. Cl.
CPC . *G01R 31/31707* (2013.01); *G01R 31/31704* (2013.01); *G01R 31/31718* (2013.01)
(58) Field of Classification Search
CPC ........ G01R 31/31707; G01R 31/31704; G01R 31/31718; G01R 31/31919; G01R 31/31708; G01R 31/31926; H04L 67/02; H04L 67/025; H04L 67/12
See application file for complete search history.

(56) References Cited

U.S. PATENT DOCUMENTS

| | | | |
|---|---|---|---|
| 5,530,373 A * | 6/1996 | Gibson | G01R 13/345 702/66 |
| 7,680,615 B2 * | 3/2010 | Huang | G01R 31/3193 712/240 |
| 10,151,791 B1 * | 12/2018 | Spinner | G01R 1/0416 |

* cited by examiner

*Primary Examiner* — Nghia M Doan
(74) *Attorney, Agent, or Firm* — Seed IP Law Group LLP; Andrew J. Harrington

(57) ABSTRACT

A test and measurement system for parallel waveform analysis acquires waveforms resulting from performing tests on a device under test (DUT) and performs, at least partially in parallel, respective analyses of the waveforms resulting from performing tests on the DUT. The system also acquires a first waveform resulting from performing a first test with an oscilloscope on a DUT and performs analysis of the first waveform at least partially in parallel with acquiring a second waveform. Additionally, the system tracks a plurality of testing assets using inventory information of a plurality of testing equipment on the network and enables remote users to access equipment logs and results of the respective analyses of the waveforms stored on a cloud computing system for performance of analytics.

28 Claims, 12 Drawing Sheets

TEST AND MEASUREMENT SYSTEM FOR PARALLEL WAVEFORM ANALYSIS

TECHNICAL FIELD

The technical field relates to test and measurement systems and, in particular, to test and measurement systems for parallel waveform analysis.

BRIEF SUMMARY

Validation and testing of integrated circuits (silicon chips or "chips") includes a process in which the manufactured design of the chip is tested for all functional correctness in a lab setup. This may be done using the chip assembled on a test board or a reference board along with other components of the system for which the chip was designed for. The goal is to validate all use cases of the chip that a customer might eventually have in a true deployment and to qualify the design for all these usage models. Such validation may also apply to testing of other types of semiconductors such as any other semiconductor such as Gallium Arsenide, Indium Phosphide, etc.

However, silicon chips and other types of semiconductors are increasing in complexity at a rapid pace with the continuing increase in the number of transistors on new semiconductor designs according to Moore's law. This increasing complexity brings with it the growing demand of customer tests to validate the next generation of hardware while reducing overall test time and increasing test throughput. In particular, with increasing silicon chip complexity, the number of scenarios to test is increasing along with the permutations of each scenario. This creates a very large challenge for silicon chip and other types of semiconductor validation. For example, silicon chip validation historically relies on testing equipment (e.g., an oscilloscope, arbitrary waveform generator (AWG), an arbitrary function generator (AFG), a bit error rate tester (BERT), etc.) for debug, characterization, compliance testing and testing at the factory. This testing equipment traditionally performs two high-level tasks. The first task is to acquire the waveform generated by the oscilloscope during a test and the second task is to analyze the waveform using digital signal processing (DSP) algorithms and validate the analog signals. Conventionally, both tasks are done sequentially. In particular, a conventional oscilloscope has dedicated hardware to acquire the waveform into memory, which then is analyzed by a central processing unit embedded within the oscilloscope. Since the tasks are performed sequentially, this increases the overall test time as silicon chips to be validated and tested increase in complexity.

Thus, in order to address the above mentioned technical problems and limitations of presently known systems, the systems and methods described herein decouple the above tasks of the acquisition of the waveform into memory and the analysis of the acquired waveform.

In one example embodiment, the systems and methods described herein acquire waveforms resulting from performing tests on a device under test (DUT) and perform, at least partially in parallel, respective analyses of the waveforms resulting from performing the tests on the DUT. The systems and methods described herein may also acquire a first waveform resulting from performing a first test with an oscilloscope on a DUT and perform an analysis of the first waveform at least partially in parallel with acquiring a second waveform resulting from performing a second test with the oscilloscope on the DUT. Such improvements thus increase test throughput and reduce overall test time.

In one example embodiment, a method for testing a device under test (DUT) in a test and measurement system includes: electronically acquiring a first waveform from the DUT resulting from performing a first test on the DUT; in response to the acquiring of the first waveform resulting from performing the first test on the DUT: beginning to electronically analyze the first waveform resulting from performing the first test on the DUT; and while analyzing the first waveform resulting from performing the first test on the DUT, beginning to electronically acquire a second waveform from the DUT resulting from performing a second test on the DUT. the method further includes, in response to acquiring the second waveform resulting from performing the second test on the DUT: while analyzing the first waveform resulting from performing the first test on the DUT, beginning to electronically analyze the second waveform resulting from performing the second test on the DUT; and beginning to electronically acquire a third waveform resulting from performing a third test on the DUT.

According to various embodiments, a non-transitory computer-readable storage medium has computer executable instructions stored thereon that, when executed by at least one processor, cause the at least one processor to perform one or more of the methods described above.

BRIEF DESCRIPTION OF THE DRAWINGS

The components in the drawings are not necessarily to scale relative to each other. Like reference numerals designate corresponding parts throughout the several views.

DETAILED DESCRIPTION

The various embodiments of the present technical disclosure provide systems and methods for silicon chip and other semiconductor validation and testing that decouple the tasks of acquisition of the waveform into memory and analysis of the acquired waveform. In one example embodiment, the systems and methods described herein acquire waveforms resulting from performing tests on a device under test (DUT) and perform, at least partially in parallel, respective analyses of the waveforms resulting from performing the tests on the DUT. The systems and methods described herein may also acquire a first waveform resulting from performing a first test with an oscilloscope on a DUT and perform an analysis of the first waveform at least partially in parallel with acquiring a second waveform resulting from performing a second test with the oscilloscope on the DUT. Such improvements thus increase test throughput and reduce overall test time.

Figure 1:
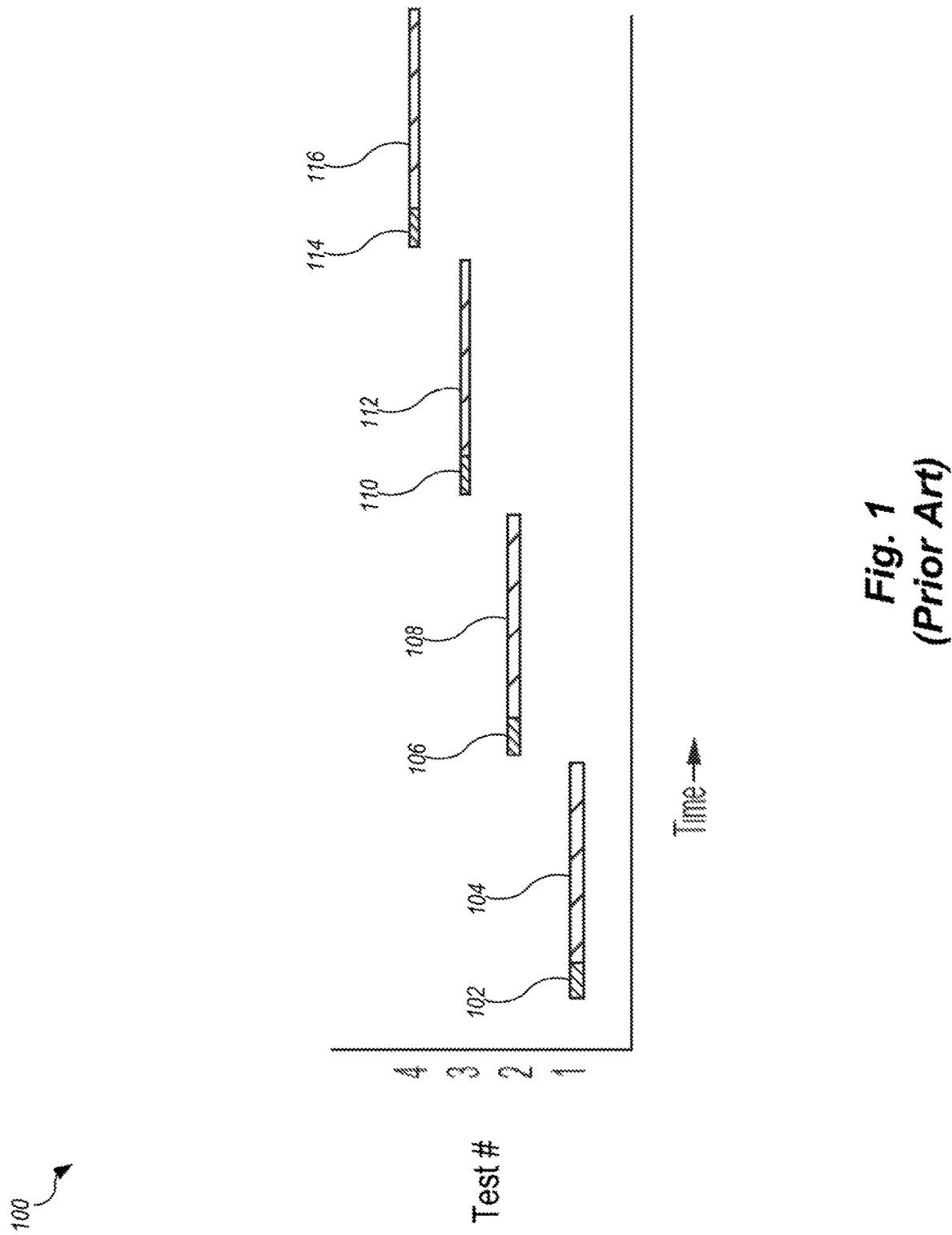
FIG. 1 is a timing diagram of a prior art oscilloscope waveform acquisition and analysis.

FIG. 1 is a timing diagram 100 of a prior art oscilloscope waveform acquisition and analysis. Shown on the vertical axis of timing diagram 100 are four example tests (Test #1, Test #2, Test #3 and Test #4).

Tests performed in semiconductor validation include generating a test signal, such as by an AWG, and applying this test signal to a DUT. An oscilloscope acquires a waveform resulting from applying the particular test signal to the DUT. The system then analyzes the waveform resulting from applying the particular test signal to the DUT. Thus, each test has a waveform acquisition portion and a waveform analysis portion. Prior art systems complete the waveform acquisition portion and the waveform analysis portion of that test before beginning the waveform acquisition portion and the waveform analysis portion of the subsequent test.

In particular, in the prior art example shown in FIG. 1, Test #1 has waveform acquisition portion 102 and waveform analysis portion 104. Test #2 has waveform acquisition portion 106 and waveform analysis portion 108. Test #3 has waveform acquisition portion 110 and waveform analysis portion 112. Finally, test #4 has waveform acquisition portion 114 and waveform analysis portion 116. The timing diagram 100 shows when each portion of each test is performed over time relative to the other tests. As shown, the prior art system completes the waveform acquisition portion and the waveform analysis portion of each test before beginning the waveform acquisition portion and the waveform analysis portion of the subsequent test. As shown, the waveform acquisition portion 102 and waveform analysis portion 104 of Test #1 are both completed before the waveform acquisition portion 106 and waveform analysis portion 108 of Test #2 begin. The waveform acquisition portion 106 and waveform analysis portion 108 of Test #2 are both completed before the waveform acquisition portion 110 and waveform analysis portion 112 of Test #3 begin. Finally, the waveform acquisition portion 110 and waveform analysis portion 112 of Test #3 are both completed before the waveform acquisition portion 114 and waveform analysis portion 116 of Test #4 begin. This sequential process can continue for a very large number of additional tests, thus resulting in a very large overall test time for the DUT.

Figure 2:
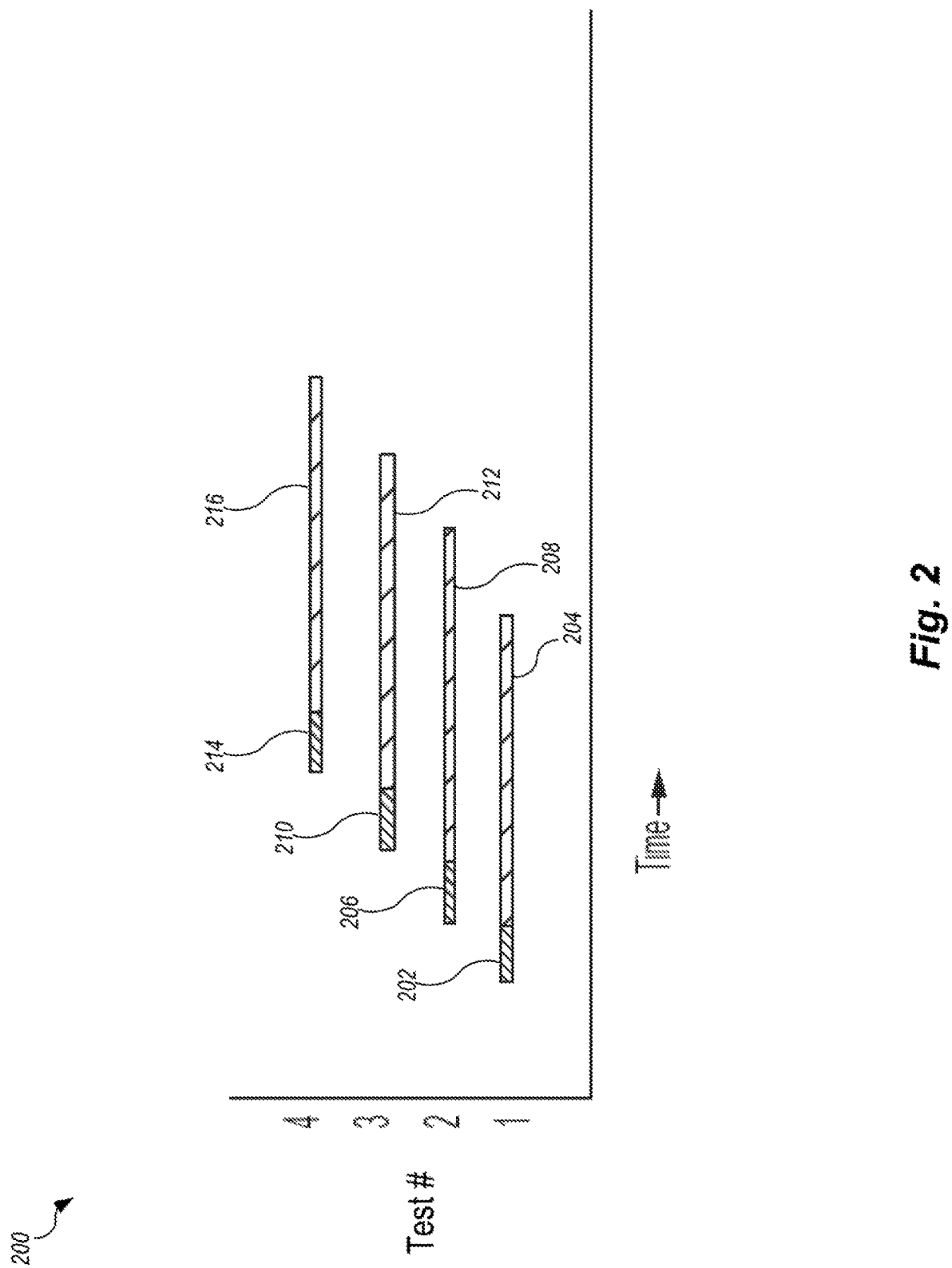
FIG. 2 is a timing diagram of oscilloscope waveform acquisition and analysis according to various example embodiments of the present disclosure.

FIG. 2 is a timing diagram 200 of oscilloscope waveform acquisition and analysis according to various example embodiments of the present disclosure.

In order to solve problems that result from systems that perform sequential semiconductor testing and validation according to the timing diagram 100 of FIG. 1, FIG. 2 illustrates acquisition of waveforms resulting from performing tests on a DUT and performing, at least partially in parallel, respective analyses of the waveforms resulting from performing the tests on the DUT. In particular, in the example shown in FIG. 2, Test #1 has waveform acquisition portion 202 and waveform analysis portion 204. Test #2 has waveform acquisition portion 206 and waveform analysis portion 208. Test #3 has waveform acquisition portion 210 and waveform analysis portion 212. Finally, Test #4 has waveform acquisition portion 214 and waveform analysis portion 216. The timing diagram 200 shows when each portion of each test is performed over time relative to the other tests. As shown, the system according to various embodiments described herein performs, at least partially in parallel, respective analyses of the acquired waveforms resulting from performing the tests on the DUT. In particular, waveform analysis portion 204 of Test #1, waveform analysis portion 208 of Test #2, waveform analysis portion 212 of Test #3 and waveform analysis portion 216 Test #4 are all performed at least partially in parallel (although, in some embodiments, the analyses of waveform acquisitions for some tests may finish before the analyses of some other tests begins).

In the present example, the system performs the waveform acquisition 202 for Test #1 and then proceeds to perform the analysis portion 204 of Test #1 based on that acquired waveform. However, before the analysis portion 204 of Test #1 is complete, the system begins to perform the waveform acquisition 206 of Test #2. Also, before the analysis portion 208 of Test #2 is complete, the system begins to perform the waveform acquisition 210 of Test #3. Furthermore, before the analysis portion 212 of Test #3 is complete, the system begins to perform the waveform acquisition 214 of Test #4.

The above parallel processes can continue for a very large number of additional tests, thus resulting in a very large increase in test throughput and reduction in overall test time for the DUT.

Figure 3:
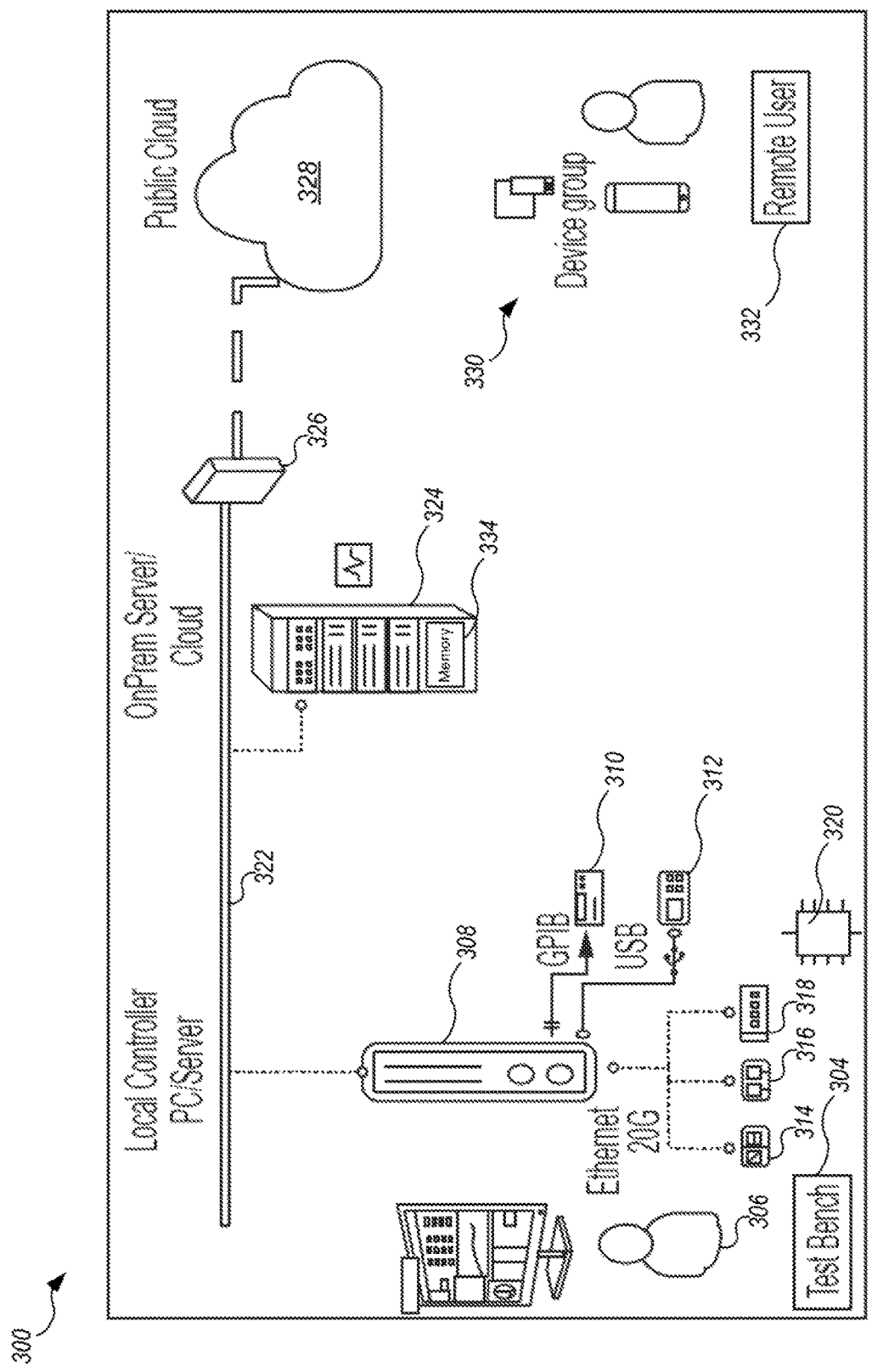
FIG. 3 is a block diagram illustrating network architecture of a test and measurement system for parallel waveform analysis, according to various example embodiments of the present disclosure.

FIG. 3 is a block diagram illustrating network architecture 300 of a test and measurement system for parallel waveform analysis, according to various example embodiments of the present disclosure.

Shown on the left of the diagram illustrating network architecture 300 are components of an example silicon chip or other semiconductor validation lab for a customer 306 including test bench 304. The validation lab including test bench 304 may include a personal computer (PC) 308, which in various embodiments may instead include other computing systems, processing devices or computer servers. Connected to the PC 308 are various test and measurement equipment including an oscilloscope 314, an AWG 316, an analyzer 318, a voltmeter 312 and a bit error rate tester (BERT) 310. Example additional equipment in various embodiments may include an arbitrary function generator (AFG) and a probe.

The testing equipment may be connected to the PC 308 via one or more types of network and/or communications connections including, but not limited to, a 20G Ethernet connection, a universal serial bus (USB) connection and a general-purpose interface bus (GPIB) connection. Such testing equipment may be directly or indirectly connected to a DUT 320. In one example, the PC 308 is configured to perform and/or control characterization, silicon/chip or other semiconductor bring-up for the DUT 320, and some level of test automation for the DUT 320. Such processes are involved in the validation and testing of silicon chips and other semiconductors and may include the systematic test of all the features of the semiconductor of the DUT 320. For example, for each test to be applied to the DUT 320, the AWG 316 may generate a test signal and this test signal is applied to the DUT 320. The oscilloscope 314 may then acquire a waveform resulting from applying each particular test signal to the DUT 320. The PC 308 may initiate and control this process, including the running of multiple tests on the DUT 320.

The PC 308 is connected to an on-premises network 322 (or "lab network") 322, which may comprise a local area network (LAN), for example, and may act as a local controller or server on the lab network 322. The lab network 322 may be separated from one or more other public or private networks via a firewall 326. Also connected to the lab network 322 is an on-premises cloud computing server 324. The PC 308 may store the acquired waveforms into a disaggregated persistent memory 334, such as by electronically communicating the waveforms acquired for multiple different tests to the on-premises cloud computing server 324 over the lab network 322. The on-premises cloud computing server 324 may enable and perform parallel analyses of the multiple acquired waveforms, each of which is a result of performing a different test on the DUT 320 at the test bench 304. For example, the cloud computing server 324 performs, at least partially in parallel, respective analyses of the acquired waveforms resulting from performing the tests at the test bench 304 on the DUT 320. The use of the PC 308, AWG 316 and oscilloscope 314 at the test bench 304 to acquire the waveform for each test and the use of the cloud computing server 324 to perform the analyses of such waveforms decouples the above tasks of the acquisition of the waveform into memory and the analysis of the acquired waveform. The cloud computing server 324 may also perform an analysis of one waveform at least partially in parallel with the oscilloscope 314 acquiring another waveform resulting from performing another test with the oscilloscope 314 on the DUT 320. Such improvements thus increase test throughput and reduce overall test time.

In some embodiments, the PC 308 and/or on-premises cloud computing server 324 may be optionally connected to a public cloud computing system 328. For example, such a public cloud computing system 328 may include a cloud computing server accessible via the lab network 322 being connected to the internet through firewall 326. In such embodiments, the PC 308 and/or on-premises cloud computing server 324 may electronically communicate the waveforms acquired for multiple different tests performed on the DUT 320 to the public cloud computing system 328 over the lab network 322 that is connected to a public network, such as the internet. In addition to or instead of the on-premises cloud computing server 324, the public cloud computing system 328 may enable and perform parallel analyses of the multiple acquired waveforms, each of which is a result of performing a different test on the DUT 320 at the test bench 304. Other computing systems or devices 330 of remote users, such as remote user 332, may also access the public cloud computing system 328 via a public network and associated test results, equipment logs and testing asset management data.

In some embodiments, the on-premises cloud computing server 324 and/or the public cloud computing system 328 may store test and validation data resulting from performing tests on the DUT 320 in a data lake implemented on such systems. A data lake as used herein is a centralized repository that stores data and shares such data with different users (e.g., devices 330 of remote users, such as remote user 332) across different locations based on a security policy. A data lake may store relational and non-relational data, which may allow data from various testing equipment and sources to be stored as-is, without having to first structure the data. For example, the on-premises cloud computing server 324 and/or the public cloud computing system 328 may also store logs from various equipment of the validation lab (e.g., including oscilloscope 314, AWG 316, analyzer 318, voltmeter 312 and BERT 310), as well inventory information to keep track of all equipment on the network 322 and optionally other networks. Results stored in the data lake may be used to perform deep analysis and correlations. With capability of analytics, users are enabled to do intelligent analysis on the test results and equipment logs.

In various embodiments, the data lake of the on-premises cloud computing server 324 and/or the public cloud computing system 328 electronically enables customer 306 and other remote users to access the results of the respective analyses of waveforms stored on the on-premises cloud computing server 324 and/or the public cloud computing system 328 for performance of analysis of the testing results. Equipment logs of testing equipment (e.g., including oscilloscope 314, AWG 316, analyzer 318, voltmeter 312 and BERT 310) resulting from the tests on the DUT 320 may be stored on the on-premises cloud computing server 324 and/or the public cloud computing system 328 as well. Storage of equipment logs of testing equipment on the on-premises cloud computing server 324 and/or the public cloud computing system 328 enables customer 306 and remote users (e.g., other computing systems or devices 330 of remote users, such as remote user 332) to access the equipment logs for performance of analytics using the equipment logs.

Inventory information of a plurality of testing assets (e.g., including oscilloscope 314, AWG 316, analyzer 318, voltmeter 312 and BERT 310) resulting from the tests on the DUT 320 may be stored on the on-premises cloud computing server 324 and/or the public cloud computing system 328 as well. This enables various systems (e.g., PC 308 and/or other computing systems or devices 330 of remote users, such as remote user 332) to keep track of the plurality of testing assets using the inventory information of the plurality of testing equipment on the network 322.

Figure 4:
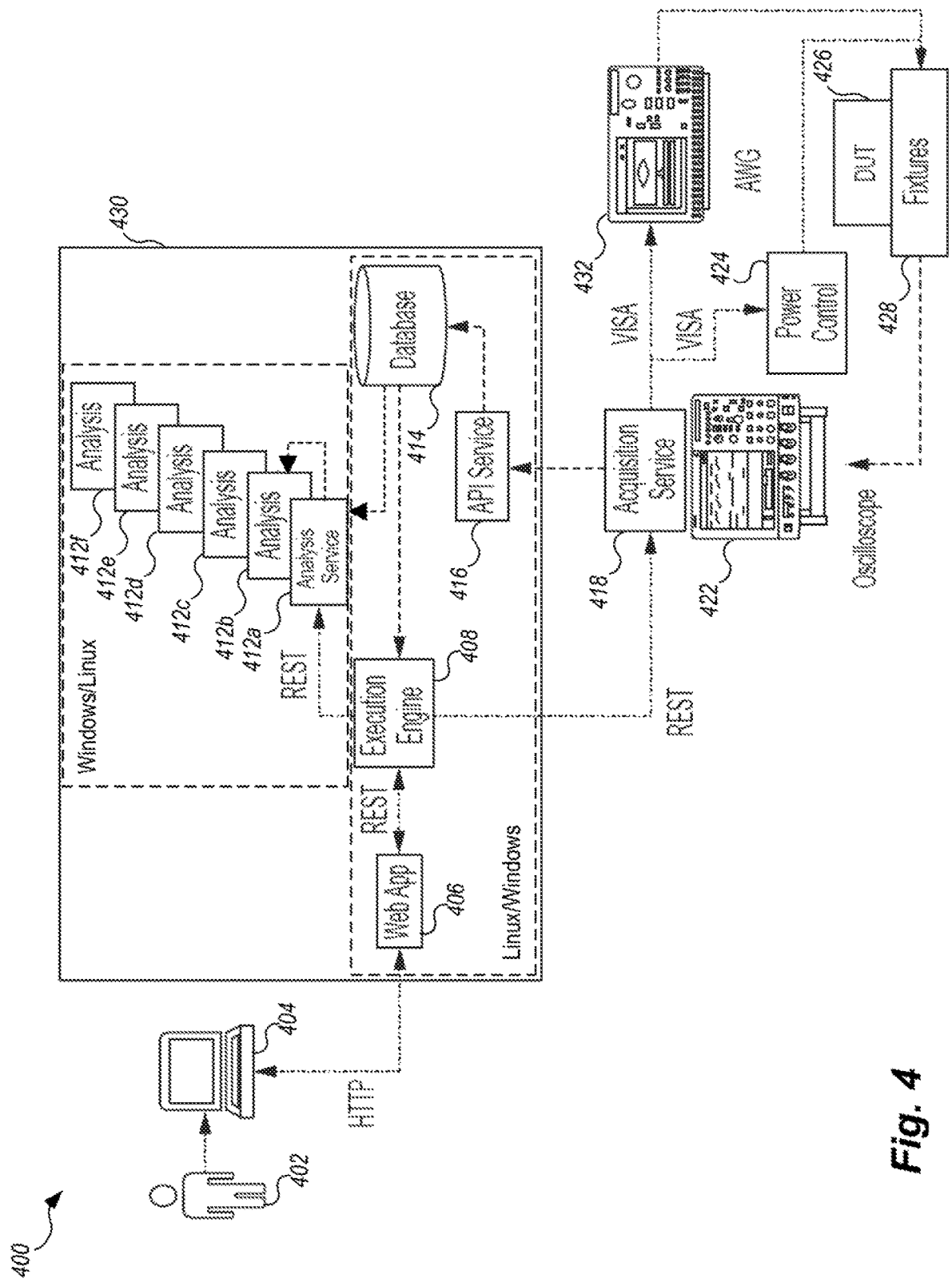
FIG. 4 is a block diagram illustrating parallel analysis components in an example architecture of a test and measurement system for parallel waveform analysis, according to various example embodiments of the present disclosure.

FIG. 4 is a block diagram illustrating parallel analysis components 412a-412e in an example architecture 400 of a test and measurement system for parallel waveform analysis, according to various example embodiments of the present disclosure.

Shown in FIG. 4 is a computing system 404 of a user 402 of a test and measurement system for parallel waveform analysis. For example, the user 402 may be the customer 306 of FIG. 3. In the present example embodiment, the computing system 404 uses a world wide web application (Web App) 406 as a front-end interface to interface and communicate with an execution engine 408 that controls parallel analyses of acquired waveforms. Thus, via Web App 406, the execution of the parallel analyses of acquired waveforms may be performed remotely from the validation lab where the waveforms are acquired. For example, the computing system 404 may be the PC 308 or one or more devices 330 of a remote user 332 of FIG. 1.

In the present example embodiment, the computing system 404 may use Web App 406 to interface with the execution engine 308 via a Representational State Transfer (RESTful or REST) application programming interface (API). A REST API is an open API, which is designed to take advantage of existing protocols. Since REST can be used over nearly any protocol, developers do not need to install libraries or additional software in order to take advantage of a REST API design. Unlike Simple Object Access Protocol (SOAP), REST is not constrained to Extensible Markup Language (XML), but instead can return XML, JavaScript Object Notation (JSON) or any other format depending on what the client requests. Using REST, unlike Remote Procedure Call (RPC), users and systems need not know procedure names or specific parameters in a specific order.

Also shown in operable communication with the execution engine 408 is the acquisition service 418. The acquisition service 418 acquires the waveforms from the DUT 426 (e.g., an integrated circuit) via interface fixtures 428 (e.g., Peripheral Component Interconnect Express fourth generation (PCIe4) fixtures) resulting from performing individual tests on the DUT 426. For example, the acquisition service 418 may be a service provided or performed by the oscilloscope 422 (e.g., a Tektronix DP073304D high-speed digital phosphor oscilloscope available from Tektronix, Inc.). However, the execution engine 408 may initiate and control when such waveform acquisitions occur via a REST API. In the present example embodiment, the acquisition service 418 is in operable communication with an AWG 432 (e.g., a Tektronix AWG7122C arbitrary waveform generator available from Tektronix, Inc.) which generates the test signals applied to the interface fixtures 428 connected to DUT 426 to perform the various individual tests on the DUT 426. The acquisition service 418 is also in operable communication with a power control unit 424 that generates power control signals applied to the interface fixtures 428 connected to DUT 426 to perform the various individual tests on the DUT 426. In an example embodiment, the acquisition service 418 may be connected to AWG 4xx and power control unit 424 via Virtual Instrument Software Architecture (VISA) connections.

The acquisition service 418 transfers the waveforms acquired from performing the tests on the DUT 426 to database 414 via an API service 416. The database 414 may be a centralized data server which keeps records of acquired waveforms and associated metadata for the waveforms. The performance of the parallel waveform analysis may be based on a microservices architecture. For example, each waveform for a particular test being transferred to the database 414 via API service 416 may trigger the execution engine 408 to instantiate or otherwise initiate an independent parallel instance of a waveform analysis application as a microservice to analyze the waveform. The execution engine 408 may initiate an independent parallel instance of a waveform analysis application as a microservice via a REST API. For example, in response to the acquisition of each waveform, an individual waveform analysis application may be initiated and the corresponding waveform communicated to the waveform analysis application from database 414. In the present example, multiple waveform analysis applications, 412*a*, 412*b*, 412*c*, 412*d*, 412*e* and 412*f* are each instantiated in response to receiving respective waveforms in database 414 resulting from running different respective tests on DUT 426. Each of the multiple waveform analysis applications, 412*a*, 412*b*, 412*c*, 412*d*, 412*e* and 412*f* are run at least partially in parallel with each other. The results of the analyses from the multiple waveform analysis applications, 412*a*, 412*b*, 412*c*, 412*d*, 412*e* and 412*f* may also be stored in database 414 for further analysis.

The execution engine 408 may operate utilizing an event notification bus used for a publish-subscribe messaging pattern to implement the parallel analyses of the acquired waveforms. The publish-subscribe messaging pattern is a messaging pattern where senders of messages, called publishers, do not program the messages to be sent directly to specific receivers, called subscribers, but instead categorize published messages (as events on an event notification bus) into classes without knowledge of which subscribers, if any, there may be. Similarly, subscribers express interest in one or more classes and only receive or read messages that are of interest, without knowledge of which publishers, if any, there are. The acquisition service 418 and/or execution engine 408 self-register on the event notification bus as subscribers and/or publishers, such that when a waveform is acquired, the execution engine 408 receives such measurements as messages on the event notification bus accordingly to trigger instantiation of the multiple waveform analysis applications (e.g., 412*a*, 412*b*, 412*c*, 412*d*, 412*e* and 412*f* accordingly). The API service 416 is configured to support such publish-subscribe messaging systems. However, in some embodiments, other such message queue models may be used and are supported by API service 416. In various embodiments, using the microservices architecture and/or the publish-subscribe messaging pattern enables the Web App 406, execution engine 408, API service 416 and database 414 to each run independently on different individual computers, servers, PCs or other computing systems. In some embodiments, the Web App 406, execution engine 408, API service 416, database 414 and waveform analysis applications 412*a*, 412*b*, 412*c*, 412*d*, 412*e* and 412*f* may comprise a parallel analysis system 430 remote from the oscilloscope 422 and computing system 404 of user 402. In some embodiments the Web App 406, execution engine 408, API service 416, database 414 may be implemented using a Linux/Windows system and the waveform analysis applications 412*a*, 412*b*, 412*c*, 412*d*, 412*e* and 412*f* may be implemented using a Windows/Linux system.

Figure 5:
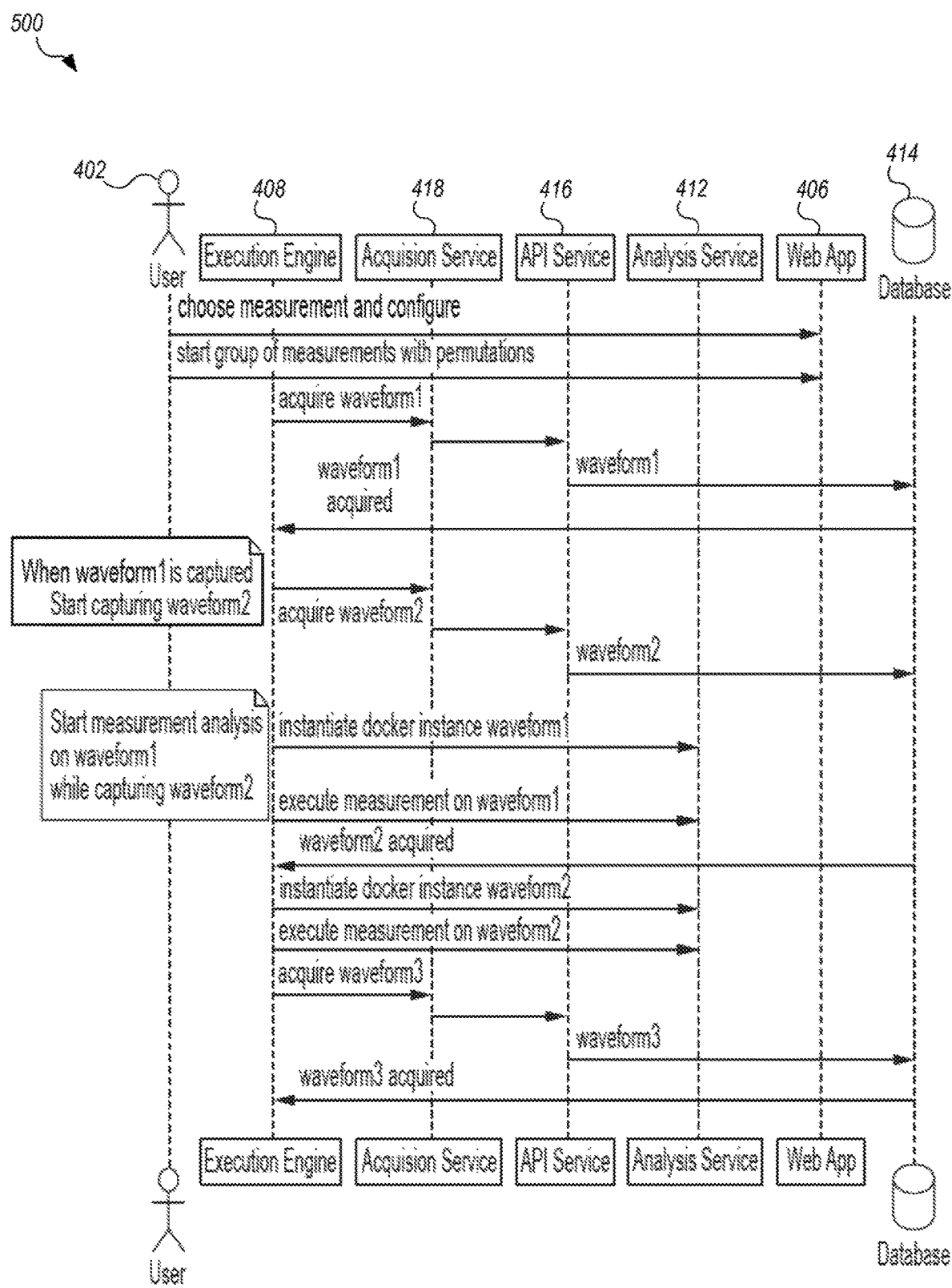
FIG. 5 is a sequence diagram illustrating example operations in a test and measurement system for parallel waveform analysis, according to various example embodiments of the present disclosure.

FIG. 5 is a sequence diagram illustrating example operations 500 in a test and measurement system for parallel waveform analysis, according to various example embodiments of the present disclosure.

The example operations 500 shown in FIG. 5 are operations that may be performed by various parallel analysis components shown in the example architecture 400 of FIG. 4. In particular, the user 402 may use the Web App 406 to initially choose the specific measurements to be performed and configure the test equipment for testing the DUT. The user 402 then uses the Web App 406 to start the group of measurements with the corresponding test permutations according to the specific measurements to be performed. Based on the corresponding test permutations, the execution engine 408 sends a message informing acquisition service 418 to start acquiring the first waveform (waveform1). The acquisition service 418 sends waveform1 to the API service 416, which then interfaces with the database 414 to send waveform1 to the database 414. Database 414 then sends a message informing the execution engine 408 that waveform1 has been captured and is ready for analysis.

The message informing the execution engine 408 that waveform1 has been captured triggers the execution engine 408 to send a message informing acquisition service 418 to start acquiring the second waveform (waveform2). Thus, when waveform1 is captured, the system starts capturing waveform2. The acquisition service 418 then sends waveform2 to the API service 416, which interfaces with the database 414 to send waveform2 to the database 414. At least partially in parallel with acquiring waveform2, the system starts analysis of waveform1. For example, the execution engine 408 instantiates a Docker® instance for waveform1, which is an example of an instance of a self-contained waveform analysis application (e.g., 412a) of FIG. 4 and comprises part of the overall analysis service 412 including such instances, and enables the execution engine 408 to execute the measurement on waveform1. Docker® is a software platform available from Docker, Inc., which packages an application and all its dependencies together in the form of software containers. This containerization aspect of Docker® ensures that the application (e.g., waveform analysis application 412a) works in any environment. However, other containerization platforms and software implementations may be used. Thus, the measurement analysis on waveform1 is started while capturing waveform2. While the measurement analysis is occurring on waveform1, database 414 sends a message informing the execution engine 408 that waveform2 has been captured and is ready for analysis.

In response to the message informing the execution engine 408 that waveform2 has been captured, the execution engine 408 instantiates a Docker® instance for waveform2, which is an example of an instance of a self-contained waveform analysis application (e.g., 412b) of FIG. 4 and comprises part of the overall analysis service 412 including such instances, and enables the execution engine 408 to execute the measurement on waveform2. While the measurement analysis for waveform2 is occurring, execution engine 408 sends a message informing acquisition service 418 to start acquiring the third waveform (waveform3). The acquisition service 418 then sends waveform3 to the API service 416, which interfaces with the database 414 to send waveform3 to the database 414. Once captured by database 414, database 414 sends a message informing the execution engine 408 that waveform3 has been captured and is ready for analysis. The above process may continue for additional waveforms, with performance, at least partially in parallel, of respective analyses of different waveforms resulting from performing different tests on a DUT with one oscilloscope, as well as performance of analyses of the waveforms at least partially in parallel with acquiring different waveforms resulting from performance of different tests on the DUT with the oscilloscope.

Figure 6:
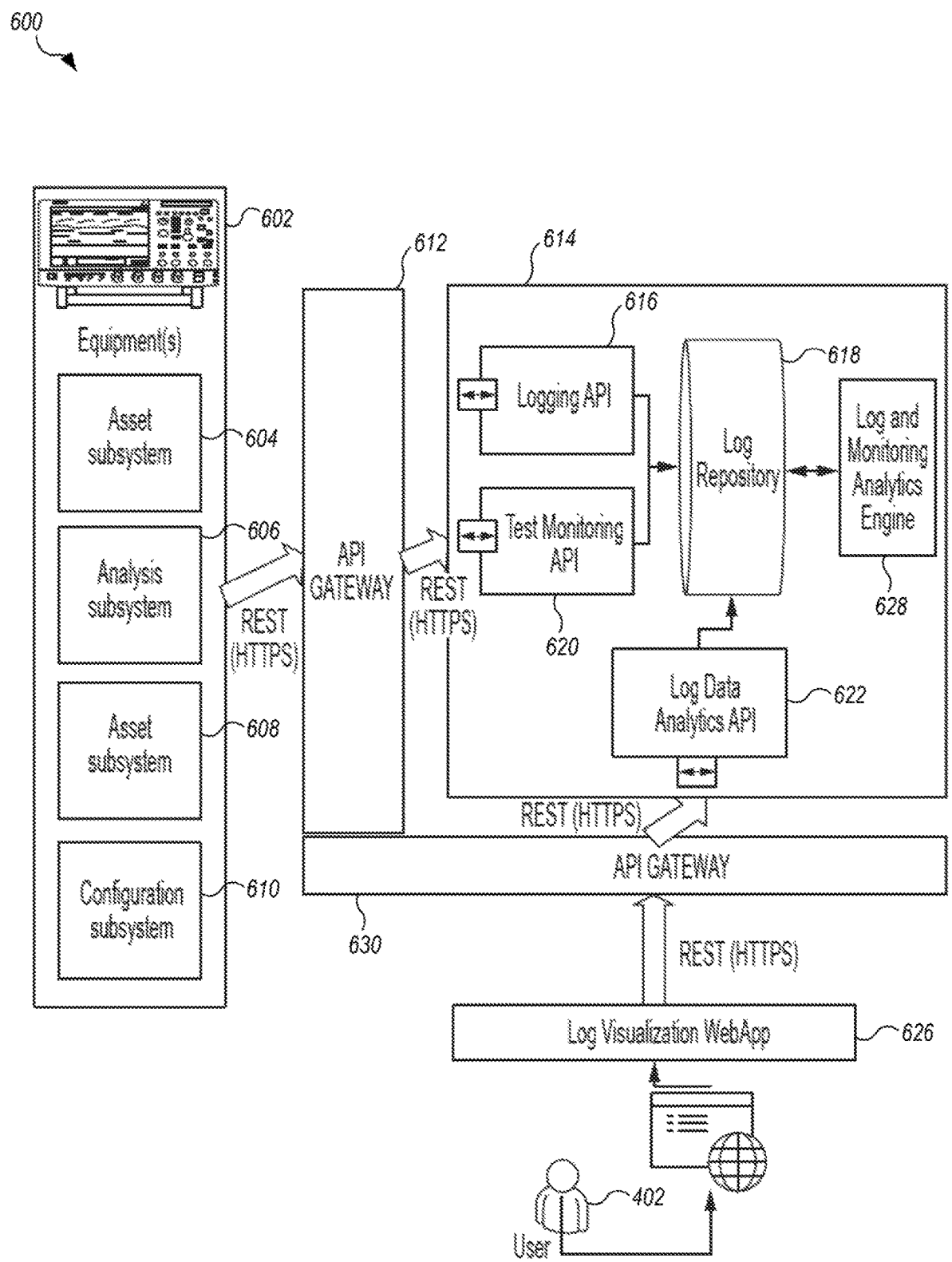
FIG. 6 is a block diagram illustrating an example logging and monitoring architecture in a test and measurement system for parallel waveform analysis, according to various example embodiments of the present disclosure.

FIG. 6 is a block diagram illustrating an example logging and monitoring architecture 600 in a test and measurement system for parallel waveform analysis, according to various example embodiments of the present disclosure.

Shown in FIG. 6 are one or more pieces of testing equipment 602, which may include asset subsystem 604, analysis subsystem 606, asset subsystem 608 and configuration subsystem 610. The testing equipment 602 may communicate using REST, via API gateway 612, with a logging API 616 and a test monitoring API 620 of a remote logging and monitoring system 614. Also shown is a log visualization Web App 626 of a computing system of a customer, such as customer 306 of FIG. 3 or user 402 of FIG. 4, that may communicate using REST, via API gateway 630, with a log data analytics API 622 of remote logging and monitoring system 614. In various embodiments, the testing equipment 602 may be or include the test and measurement equipment of the example validation lab for customer 306 and/or the devices 330 of remote user 332 of FIG. 3. In various embodiments, the testing equipment 602 may be or include the test and measurement equipment, such as the oscilloscope 422 and the AWG 432 of FIG. 4. The Web App 626 may be or include the Web App 406 of FIG. 4, which is the front-end interface to and enables communication with the execution engine 408 of FIG. 4 that controls parallel analyses of acquired waveforms.

A log repository 618 receives from the testing equipment 602 corresponding logging data via logging API 616 and test monitoring data via test monitoring API 620. The log repository 618 also receives corresponding log data analytics data via log data analytics API 622 communicated from the log visualization Web App 626. The remote logging and monitoring system 614 stores on log repository 618 (which may be a cloud computing system) equipment logs of testing equipment 602 resulting from tests run on a DUT. The remote logging and monitoring system 614 enables remote users, such as user 402, to access the equipment logs, such as via API gateway 630, for performance of analytics using the equipment logs.

Using the data stored in the log repository 618, the log and monitoring analytics engine 628 captures the detail log of activities in test and measurement instruments, such as test equipment 602 and a corresponding software layers. Examples of different categories of logs stored in the log repository 618 include error, warning, information, and debug logs. The log and monitoring analytics engine 618 monitors equipment and testing logs and may capture or enable the capture of system metrics including central processing unit (CPU) metrics, memory metrics, and the number of instances of a particular service (e.g., the number of parallel analysis components 412) running at any point of time. Test monitoring performed by the log and monitoring analytics engine 618 may also capture events in a test. The test monitoring of the log and monitoring analytics engine 618 may also provide the details about the test execution, such as the time taken in the test for each activity.

Figure 7:
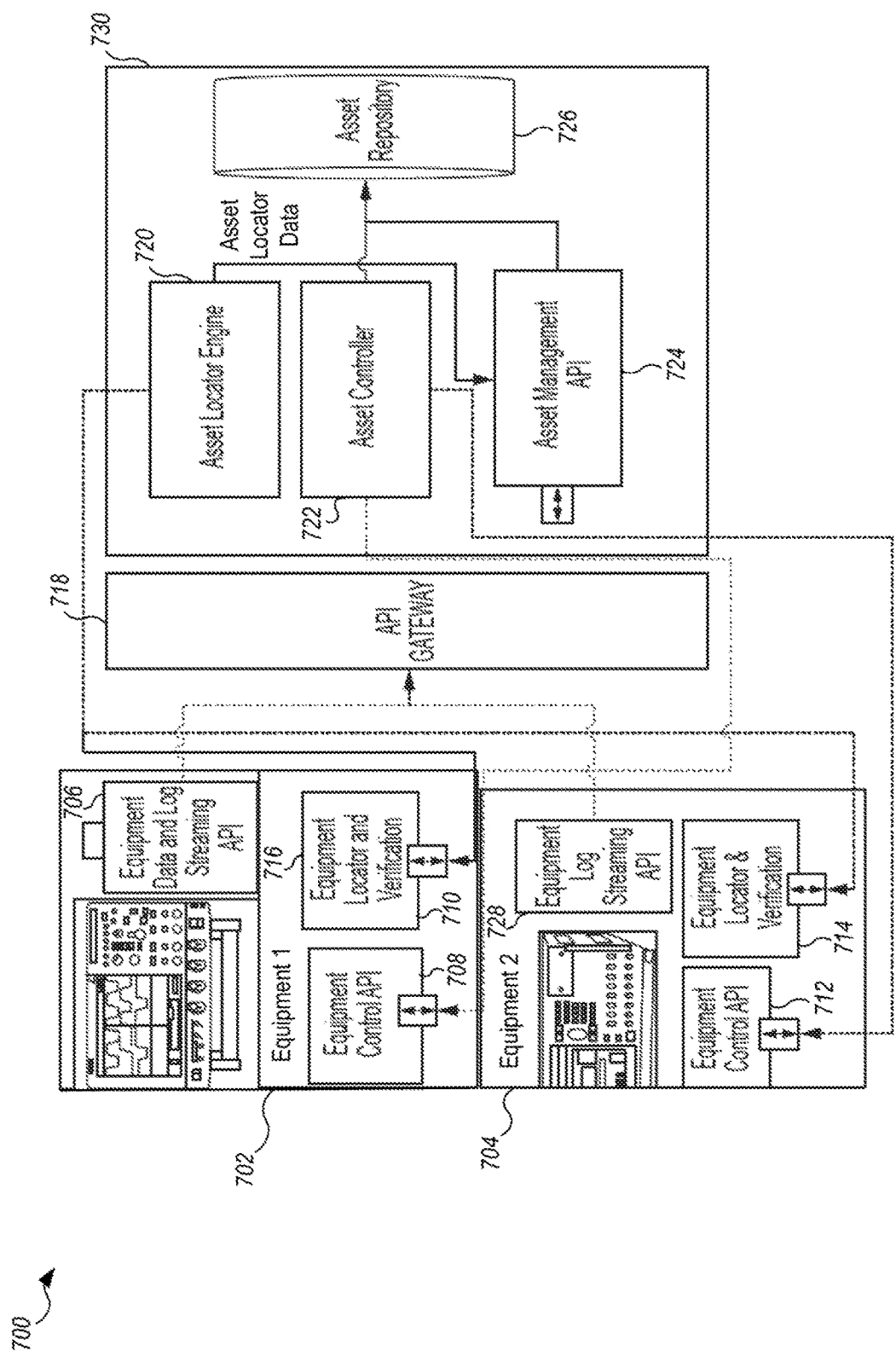
FIG. 7 is a block diagram illustrating an example asset management and control architecture in a test and measurement system for parallel waveform analysis, according to various example embodiments of the present disclosure.

FIG. 7 is a block diagram illustrating an example asset management and control architecture 700 in a test and measurement system for parallel waveform analysis, according to various example embodiments of the present disclosure.

Shown is a plurality of testing assets including a plurality of pieces of equipment. For example, equipment 1 702 and equipment 2 702 may be any two different pieces of test equipment, e.g., an oscilloscope, a DUT, voltmeter, a probe, and virtual assets such as testing software or one or more signal generators 704 (such as an AWG and/or AFG). In various embodiments, equipment 1 702 or equipment 2 702 may be or include any piece of the test and measurement equipment of the example validation lab for customer 306 and/or the devices 330 of remote user 332 of FIG. 3. In the present example, for equipment 1 702, there may be an equipment data and log streaming API 706, an equipment control API 708 and an equipment locator and verification API 710. Also, for equipment 2 704, there may be an equipment log streaming API 728, an equipment locator and verification API 714 and an equipment control API 712.

Also shown is a remote asset management system 730 including an asset locator engine 720 (which provides asset locator data to an asset management API 724), an asset controller 722 and an asset repository 726. The equipment data and log streaming API 706 and equipment log streaming API 728 interface with and communicate equipment data and log data to the asset management API 724 of the asset management system 730 via an API gateway 718. The asset repository 726 stores such data regarding the equipment 702 and generator 704 (e.g., inventory information, status of equipment, usage of equipment, location of equipment, etc.) communicated via the API gateway 718 and asset management API 724 to manage the equipment 702 and generator 704, including instances of software for testing the DUT. The asset management system 730 uses such information stored in asset repository 726 to keep track of the plurality of testing assets, including equipment 702 and generator 704 and various devices shown in FIG. 3 and FIG. 4.

The asset controller 722 may also control the equipment 702 and generator 704 to perform certain actions in the respective asset via control signals sent via the asset controller 722 and asset locator engine 720 to the respective equipment control API 708 and an equipment locator and verification API 710 of the equipment 702 and the respective equipment locator and verification API 714 and equipment control API 712 of the generator 704. For example, the asset controller 722 may manage automatic software upgrades of the plurality of testing assets, including the equipment 702 and generator 704 and manage licenses for such assets. Also, using the data stored in the asset repository 726, the asset management system 730 may determine usage patterns of the plurality of testing assets to facilitate optimization of resource usage by users.

Figure 8:
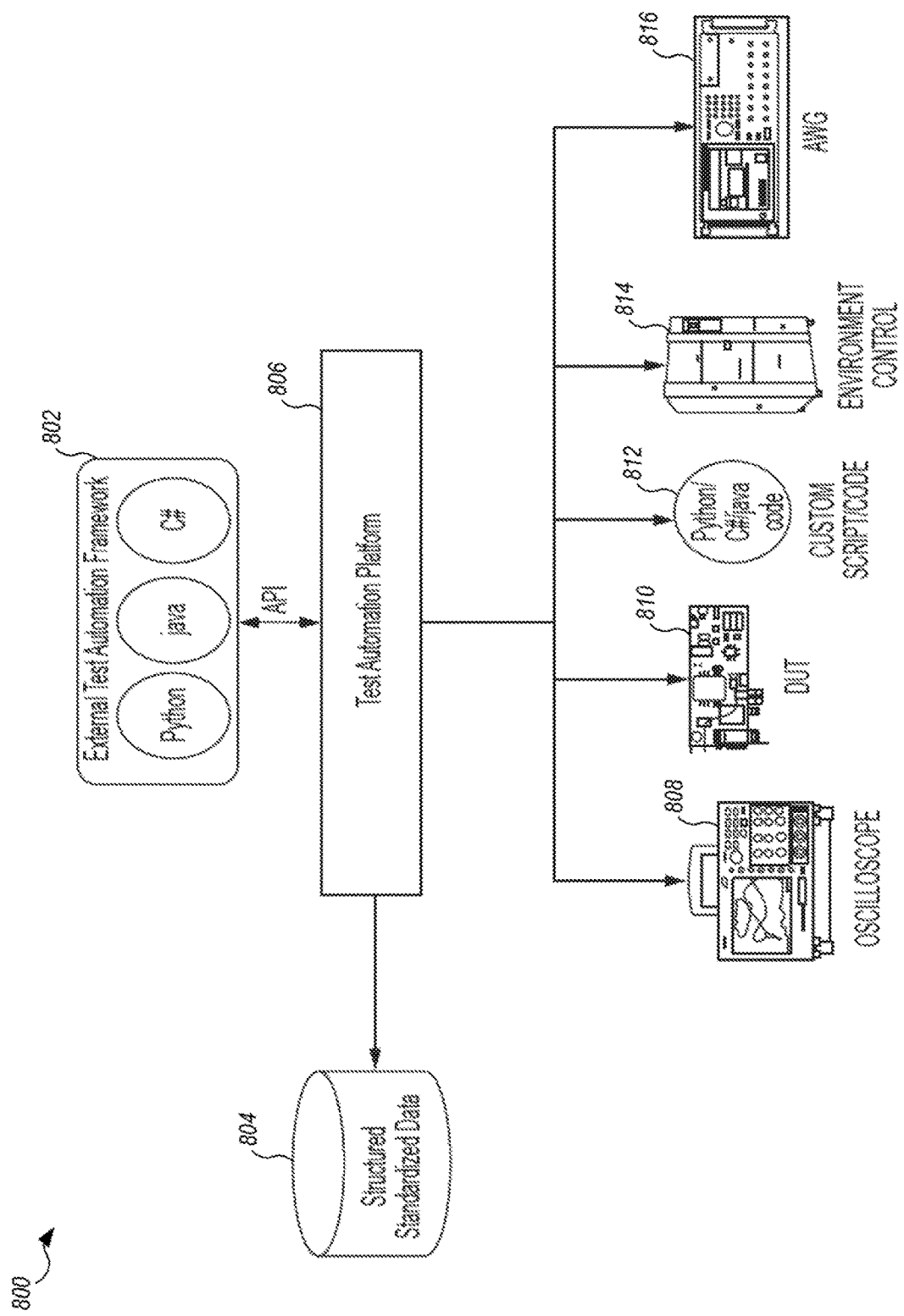
FIG. 8 is a block diagram illustrating an example test automation platform architecture within which a test and measurement system for parallel waveform analysis may operate, according to various example embodiments of the present disclosure.

FIG. 8 is a block diagram illustrating an example test automation platform architecture 800 within which a test and measurement system for parallel waveform analysis may operate, according to various example embodiments of the present disclosure.

Shown in FIG. 8 is a test automation platform 806 in communication via an API with an external test automation framework 802 that provides automated testing for a DUT 810. The test automation platform 806 is in communication with and may control an oscilloscope 808, custom test scripts and code 812, environmental control system 814 and AWG 816 for testing a DUT 810. Such test automation may be configured, initiated, updated and/or controlled remotely via an external test automation framework 802 over an open API. Physical hardware-agnostic test suites, report templates and equipment management may also be provided via the test automation platform 806 in communication with the external test automation framework 802. In various embodiments, the external test automation framework 802 is a software framework that may be built and/or implemented with various programming languages including Python, Java and C#. Also shown is a database 804 of structured standardized data that the test automation platform 806 may update with agnostic test suites, report templates, equipment management data and other data regarding testing and testing equipment.

The test automation platform 806 and the external test automation framework 802 may include and/or be integrated with the parallel analysis components in FIG. 4 with which the user 403 communicates via Web App 406. Also, the database 804 may be or incorporate data of the database 414 of FIG. 4, the log repository 618 of FIG. 6 and/or the asset repository of FIG. 726.

Figure 9:
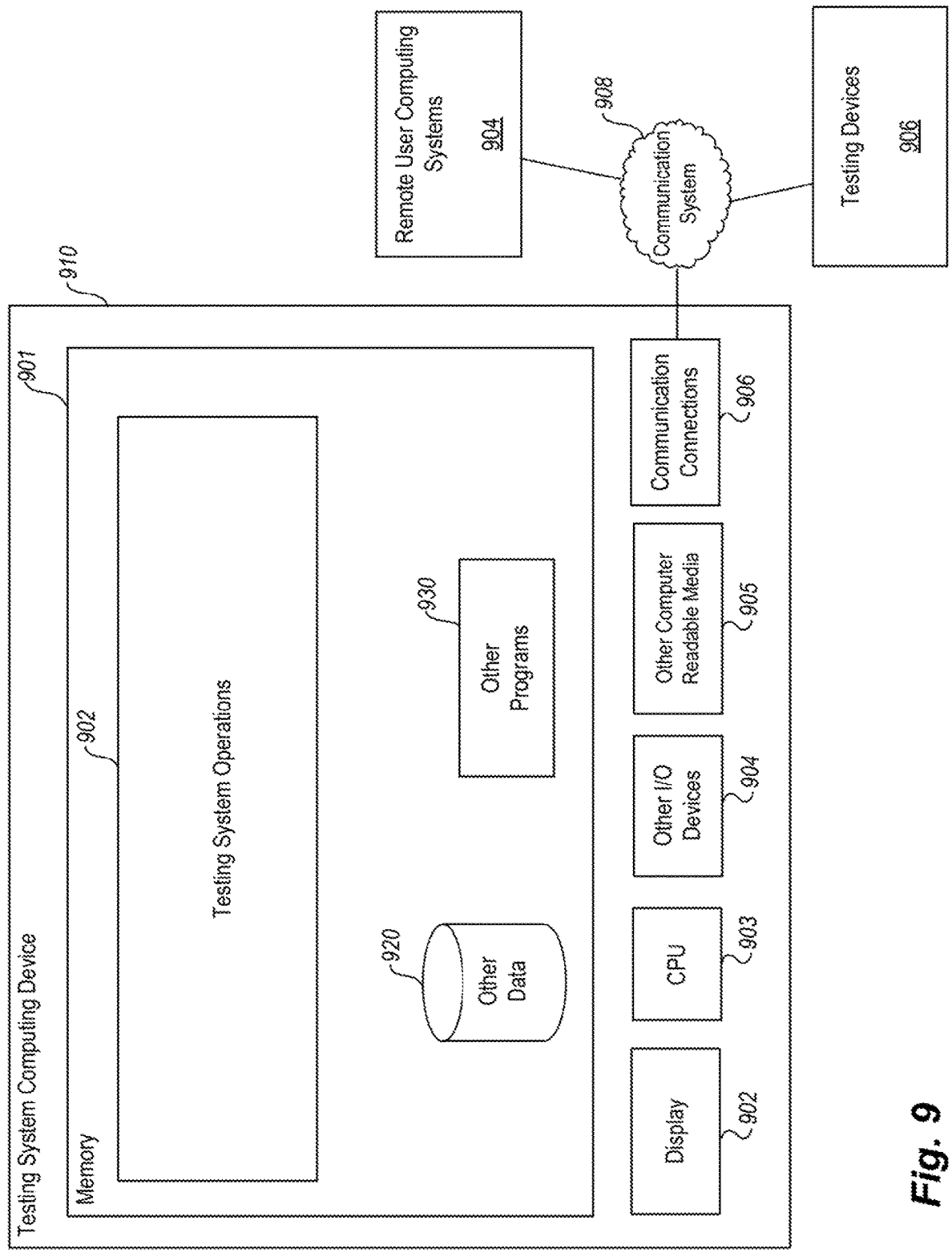
FIG. 9 is an overview block diagram illustrating an example testing system computing device in which embodiments of the test and measurement system for parallel waveform analysis may be implemented, according to various example embodiments.

FIG. 9 is an overview block diagram illustrating an example computing device 910 in which embodiments of the test and measurement system for parallel waveform analysis may be implemented, according to various example embodiments.

Computing device 910 is an example computing device that may be, or may be included in, the test and measurement systems for parallel waveform analysis systems described herein. For example, computing device 910 is an example computing device that may be, or may comprise part of, PC 308, on-premises cloud computing server 324, a computing device of public cloud computing system 328, and/or computing systems or devices 330 of remote users of FIG. 3. Also, storage systems of computing device 910 may include and/or implement database 414 of FIG. 4, the log repository 618 of FIG. 6 and/or the asset repository 726 of FIG. 7.

In the embodiment shown, testing system computing device 910 comprises a computer memory ("memory") 901, a display 902 (including, but not limited to a light emitting diode (LED) panel, liquid crystal display (LCD), touch screen display, etc.), one or more Central Processing Units ("CPU") 903, Input/Output devices 904 (e.g., button panel, keyboard, mouse, RF or infrared receiver, universal serial bus (USB) ports, other communication ports, and the like), other computer-readable media 905, and communication connections 206. The testing systems operations 902 such as those described herein for parallel waveform analysis are shown residing in memory 901. In other embodiments, some portion of the contents and some, or all, of the components of the testing systems operations 902 may be stored on and/or transmitted over the other computer-readable media 905. In various embodiments, storage of the cloud computing system 328, disaggregated persistent memory 334, database 414, log repository 618, asset repository 726, and/or database 804 may comprise, include or be part of other data storage 920.

The components of testing system operations 902 preferably execute on one or more CPUs 903 and perform or otherwise facilitate acquiring waveforms resulting from performing tests on a device under test (DUT) and performing, at least partially in parallel, respective analyses of the waveforms resulting from performing the tests on the DUT. The testing system operations 902 may also execute on one or more CPUs 903 to acquire a first waveform resulting from performing a first test with an oscilloscope on a DUT and perform an analysis of the first waveform at least partially in parallel with acquiring a second waveform resulting from performing a second test with the oscilloscope on the DUT.

In other embodiments, other processing devices and configurations may be used, including, but not limited to, graphics processing units (GPU), ASICs and embedded CPU/GPU blocks. The testing system operations 902 may operate as, be part of, or work in conjunction and/or cooperation with, various software applications stored in memory 901. The testing systems operations 902 also facilitate communication, via communication system 908 with remote user computing systems 904, such as computing systems or devices 330 shown in FIG. 3, and with testing devices 906, such as test and measurement equipment of the example validation lab for customer 306 and/or the devices 330 of remote user 332 of FIG. 3.

Communication system 908 may include many different types of communication media including those utilized by various different physical and logical channels of communication, now known or later developed. Non-limiting media and communication channel examples include one or more, or any operable combination of: Universal Serial Bus (USB), Peripheral Component Interconnect (PCI), Wi-Fi systems, WLAN systems, short range wireless (e.g., Bluetooth®) systems, peer-to-peer network systems, High-Definition Multimedia Interface (HDMI), hardwired systems, communication busses, computer network cabling, wide area network (WAN) systems, the internet, cable systems, telephone systems, fiber optic systems, microwave systems, asynchronous transfer mode ("ATM") systems, frame relay systems, digital subscriber line ("DSL") systems, radio frequency ("RF") systems, cellular systems, and satellite systems.

The testing system operations 902 may include one or more APIs (e.g., API 620, API service 416, API 616, API 620, API 622, API gateway 630, etc.) described throughout the disclosure that provide programmatic access to one or more functions or services of the testing system operations 902, including, for example services of the execution engine 408 and acquisition service 418. APIs such as API 620, API service 416, API 616, API 620, API 622 and API gateway 630 may provide a programmatic interface to one or more functions of the testing system operations 902 that may be invoked by the user Web App 40, execution engine 408, acquisition service 418, and/or one of the other programs, engines, databases or services described herein represented by other programs 230.

In an example embodiment, components/modules of the testing system operations 902 are implemented using standard programming techniques. For example, the testing system operations 902 may be implemented as a "native" executable running on the CPU 903, along with one or more static or dynamic libraries. In other embodiments, the testing system operations 902 may be implemented as instructions processed by a virtual machine that executes as one of the other programs 930, or as microservices delivered via a containerization platform. In general, a range of programming languages may be employed for implementing such example embodiments, including representative implementations of various programming language paradigms, including but not limited to, object-oriented (e.g., JSON, Java, C++, C#, Visual Basic.NET, Smalltalk, and the like), functional (e.g., ML, Lisp, Scheme, and the like), procedural (e.g., C, Pascal, Ada, Modula, and the like), scripting (e.g., Perl, Ruby, Scratch, Python, JavaScript, VBScript, and the like), or declarative (e.g., SQL, Prolog, and the like).

In a software or firmware implementation, instructions stored in a memory configure, when executed, one or more processors (e.g., CPUs) of the testing system computing device 910 to perform the functions of the testing system operations 902. The instructions cause the CPU 903 or some other processor, such as an I/O controller/processor, to perform the processes described herein.

The embodiments described herein may also use other synchronous or asynchronous client-server computing techniques. However, the various components may be implemented using more monolithic programming techniques as well, for example, as an executable running on a single CPU computer system, or alternatively decomposed using a variety of structuring techniques including but not limited to, multiprogramming, multithreading, client-server, or peer-to-peer (e.g., Bluetooth® wireless technology), running on one or more computer systems each having one or more CPUs or other processors. Some embodiments may execute concurrently and asynchronously, and communicate using message passing techniques. Equivalent synchronous embodiments are also supported by implementation of testing system operations 902. Also, other functions could be implemented and/or performed by each component/module, and in different orders, and by different components/modules, yet still achieve the functions of the implementation.

In addition, programming interfaces to the data stored as part of the testing system operations 902 can be available by mechanisms such as through C, C++, C#, and Java APIs; libraries for accessing files, databases, or other data repositories; scripting languages; or Web servers, FTP servers, or other types of servers providing access to stored data and machine learning models.

Different configurations and locations of programs and data are contemplated for use with techniques described herein. A variety of distributed and/or cloud computing techniques are appropriate for implementing the components of the illustrated embodiments in a distributed manner including but not limited to TCP/IP, REST, sockets, RPC, RMI, HTTP, and Web Services (XML-RPC, JAX-RPC, SOAP, and the like). Other variations are possible. Other functionality could also be provided by each component/module, or existing functionality could be distributed amongst the components/modules in different ways, yet still achieve the functions of the testing systems operations 902.

Furthermore, in some embodiments, some or all of the components of the testing systems operations 902 may be implemented or provided in other manners, such as at least partially in firmware and/or hardware, including, but not limited to one or more application-specific integrated circuits ("ASICs"), standard integrated circuits, controllers (e.g., by executing appropriate instructions, and including microcontrollers and/or embedded controllers), field-programmable gate arrays ("FPGAs"), complex programmable logic devices ("CPLDs"), and the like. Some or all of the system components and/or data structures may also be stored as contents (e.g., as executable or other machine-readable software instructions or structured data) on a computer-readable medium (e.g., as a hard disk; a memory; a computer network, cellular wireless network or other data transmission medium; or a portable media article to be read by an appropriate drive or via an appropriate connection, such as a flash memory device) so as to enable or configure the computer-readable medium and/or one or more associated computing systems or devices to execute or otherwise use, or provide the contents to perform, at least some of the described techniques.

Figure 10:
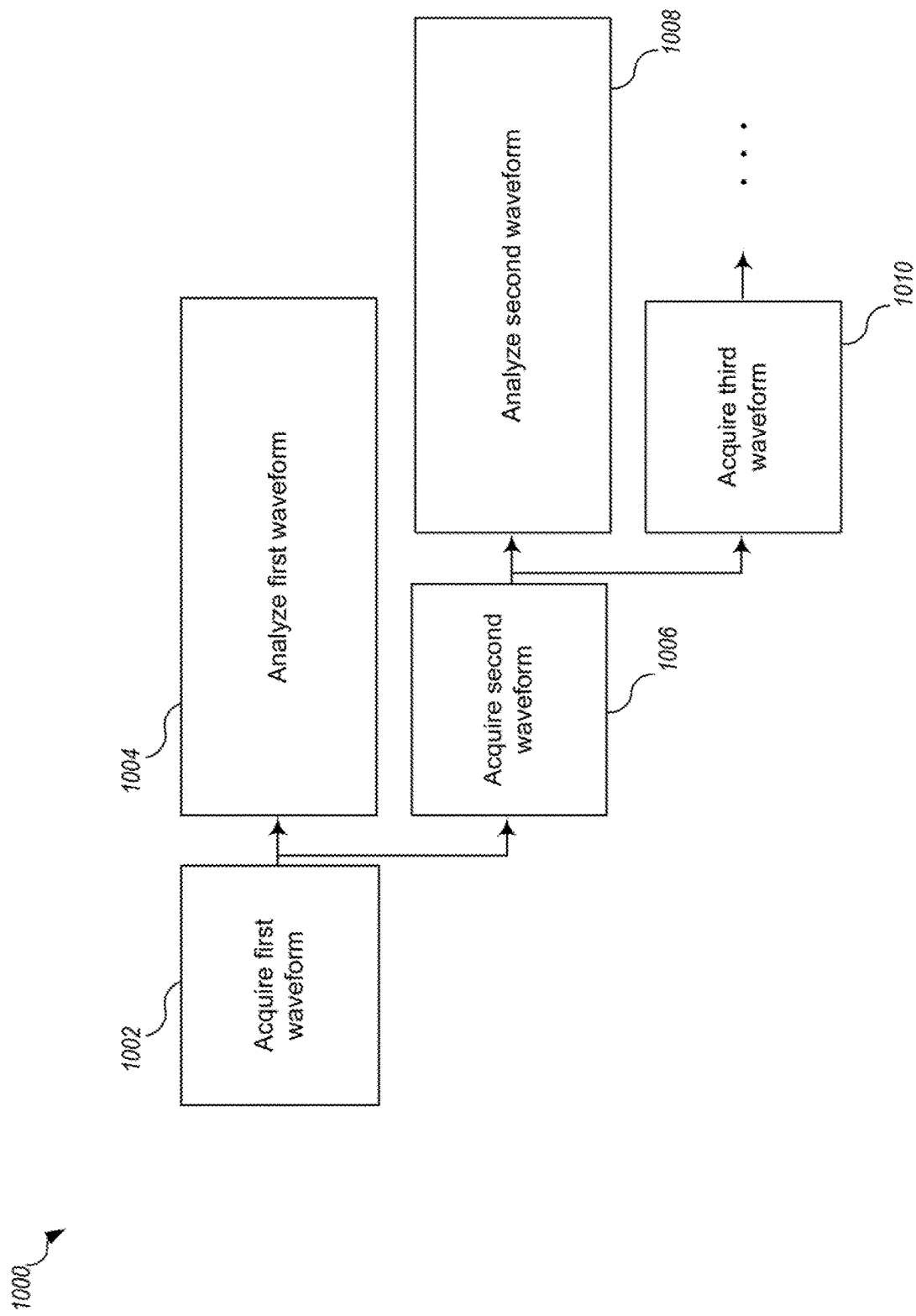
FIG. 10 is a flow diagram of an example computerized method for parallel waveform analysis in a test and measurement system for parallel waveform analysis, according to various example embodiments.

FIG. 10 is a flow diagram of an example computerized method 1000 for parallel waveform analysis in a test and measurement system for parallel waveform analysis, according to various example embodiments.

At 1002 a test and measurement system electronically acquires a first waveform from a device under test (DUT) resulting from performing a first test on the DUT.

At 1004, in response to the acquiring of the first waveform resulting from performing the first test on the DUT, the system begins to electronically analyze the first waveform resulting from performing the first test on the DUT.

At 1006, also in response to the acquiring of the first waveform resulting from performing the first test on the DUT, while analyzing the first waveform resulting from performing the first test on the DUT, the system begins to electronically acquire a second waveform from the DUT resulting from performing a second test on the DUT.

At 1008, in response to acquiring the second waveform resulting from performing the second test on the DUT, also while analyzing the first waveform resulting from performing the first test on the DUT, the system begins to electronically analyze the second waveform resulting from performing the second test on the DUT.

At 1010, also in response to acquiring the second waveform resulting from performing the second test on the DUT, the system begins to electronically acquire a third waveform resulting from performing a third test on the DUT. The beginning to acquire the third waveform resulting from performing a third test on the DUT is also performed while analyzing the first waveform resulting from performing the first test on the DUT.

The system may also electronically acquire additional waveforms resulting from performing additional tests on the DUT. The system may electronically perform, at least partially in parallel, respective analyses of the additional waveforms resulting from performing additional tests on the DUT. The acquisition of one or more of the additional waveforms resulting from performing additional tests on the DUT is performed, at least partially in parallel, with performing respective analyses of other waveforms than the additional waveforms.

Figure 11:
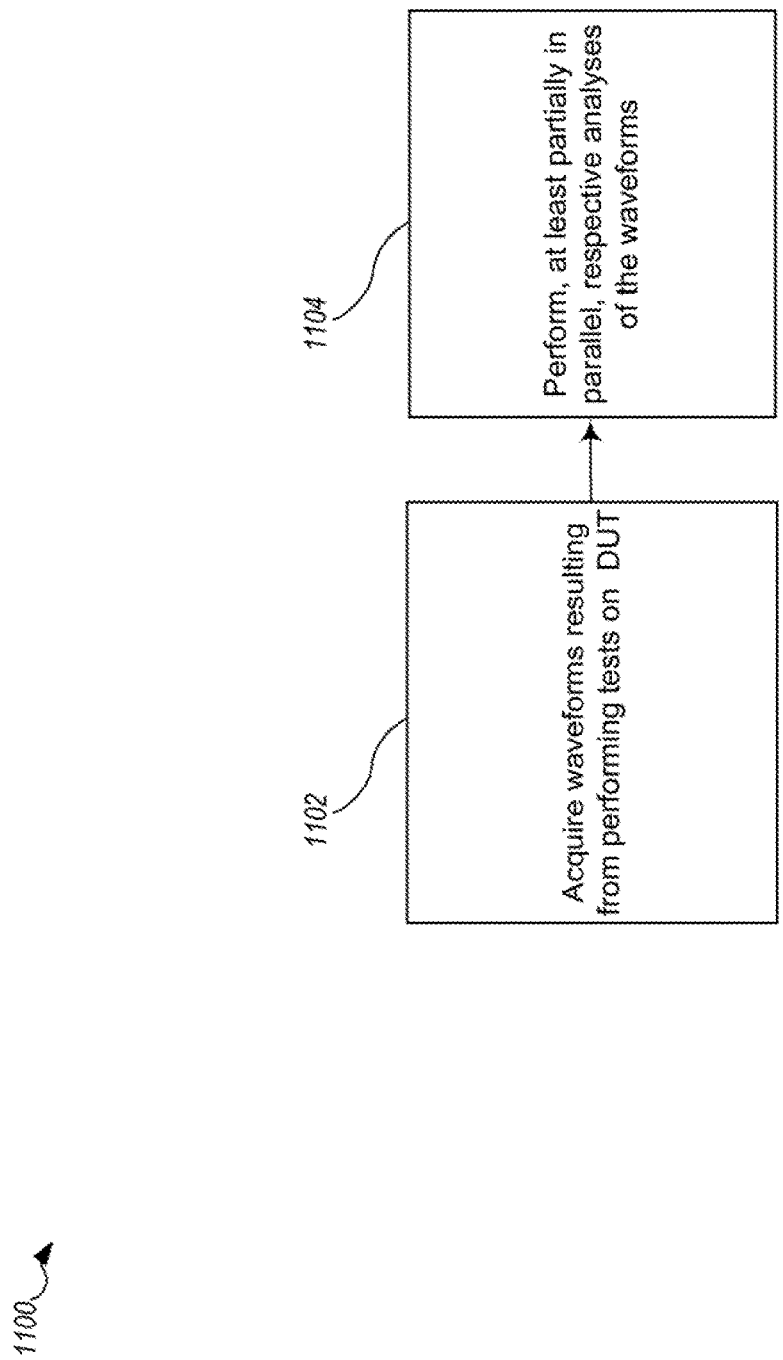
FIG. 11 is a flow diagram of another example computerized method for parallel waveform analysis in a test and measurement system for parallel waveform analysis, according to various example embodiments.

FIG. 11 is a flow diagram of another example computerized method 1100 for parallel waveform analysis in a test and measurement system for parallel waveform analysis, according to various example embodiments.

At 1102, a test and measurement system acquires waveforms resulting from performing tests on a device under test (DUT). For example, the system may acquire the waveforms from an oscilloscope and store the waveforms into a disaggregated persistent memory.

At 1104, the system performs, at least partially in parallel, respective analyses of the waveforms resulting from performing the tests on the DUT. The system may automatically store, on a cloud computing system, results of the respective analyses of the waveforms and electronically enable remote users to access the results of the respective analyses of the waveforms stored on the cloud computing system for performance of analysis of the results.

Figure 12:
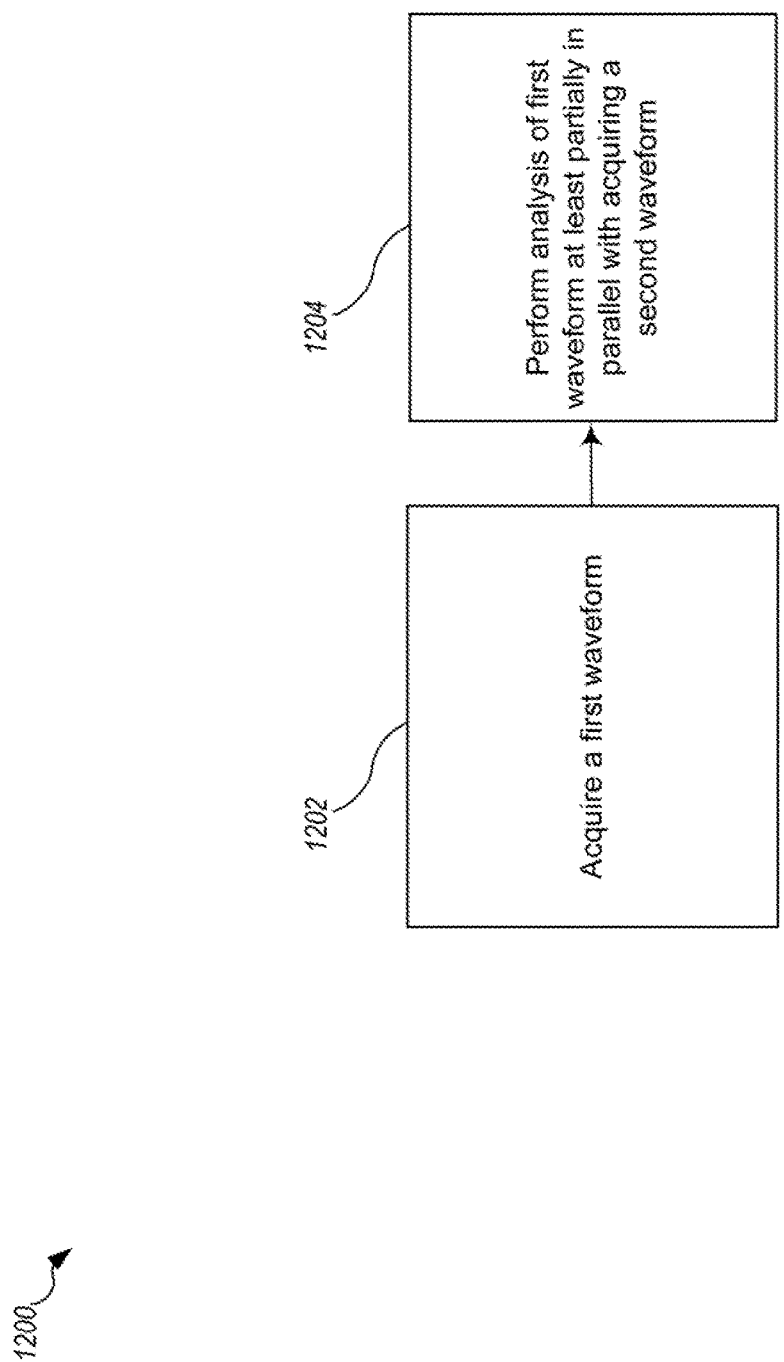
FIG. 12 is a flow diagram of an example computerized method for parallel waveform analysis in a test and measurement system for parallel waveform analysis involving performing an analysis of first waveform at least partially in parallel with acquiring a second waveform, according to various example embodiments.

FIG. 12 is a flow diagram of an example computerized method 1200 for parallel waveform analysis in a test and measurement system for parallel waveform analysis involving performing an analysis of first waveform at least partially in parallel with acquiring a second waveform, according to various example embodiments.

At 1202, a test and measurement system acquires a first waveform resulting from performing a first test with an oscilloscope on a device under test (DUT).

At 1204, the system performs an analysis of the first waveform at least partially in parallel with acquiring a second waveform resulting from performing a second test with the oscilloscope on the DUT. For example, a waveform analysis application for a first waveform may be instantiated by an execution engine in response to the acquisition of the first waveform. The system may then instantiate, by a waveform analysis execution engine, in response to the acquisition of a second waveform, an instance of a waveform analysis application for the second waveform at least partially in parallel with executing a waveform analysis application for the first waveform. The system may also store, on a cloud computing system, equipment logs of testing equipment resulting from the additional tests on the DUT and enable remote users to access the equipment logs for performance of analytics using the equipment logs.

While various embodiments have been described herein above, it is to be appreciated that various changes in form and detail may be made without departing from the spirit and scope of the invention(s) presently or hereafter claimed.

We claim:

1. A method for testing a device under test (DUT) in a test and measurement system, comprising:
   acquiring, by a testing asset of the test and measurement system, a first waveform from the DUT resulting from performing a first test on the DUT;
   in response to the acquiring of the first waveform resulting from performing the first test on the DUT:
   beginning to analyze the first waveform resulting from performing the first test on the DUT; and
   while analyzing the first waveform resulting from performing the first test on the DUT, beginning to acquire, by the testing asset of the test and measurement system, a second waveform from the DUT resulting from performing a second test on the DUT; and
   in response to acquiring the second waveform resulting from performing the second test on the DUT:
   while analyzing the first waveform resulting from performing the first test on the DUT, beginning to analyze the second waveform resulting from performing the second test on the DUT.

2. The method of claim 1, further comprising:
   beginning to acquire a third waveform resulting from performing a third test on the DUT while analyzing the first waveform resulting from performing the first test on the DUT.

3. The method of claim 1, further comprising:
   acquiring additional waveforms resulting from performing additional tests on the DUT; and
   performing, at least partially in parallel, respective analyses of the additional waveforms resulting from performing additional tests on the DUT.

4. The method of claim 3 wherein the acquisition of one or more of the additional waveforms resulting from performing additional tests on the DUT is performed, at least partially in parallel, with performing respective analyses of other waveforms than the one or more of the additional waveforms.

5. The method of claim 3 wherein the acquiring the additional waveform includes:
   acquiring the additional waveforms using an oscilloscope; and
   storing the additional waveforms into a disaggregated persistent memory.

6. The method of claim 5 wherein the storing the additional waveforms into a disaggregated persistent memory includes:
   receiving, via an application programming interface (API) the additional waveforms from an acquisition engine that runs on the oscilloscope; and
   storing the received waveforms in a database on a centralized data server remotely accessible to a system of a remote user.

7. The method of claim 3 wherein the performing, at least partially in parallel, respective analyses includes performing, at least partially in parallel, respective analyses of the additional waveforms on a cloud computing system.

8. The method of claim 7 further comprising:
   automatically storing, on the cloud computing system, results of the respective analyses of the additional waveforms; and
   enabling a remote user to access the results of the respective analyses of the additional waveforms stored on the cloud computing system.

9. The method of claim 7 further comprising:
   storing, on the cloud computing system, equipment logs of testing equipment resulting from the additional tests on the DUT; and
   enabling a remote user to access the equipment logs.

10. The method of claim 7 further comprising:
   storing, on the cloud computing system, inventory information of a plurality of testing assets, including an oscilloscope, on a network to which the oscilloscope and the cloud computing system are connected.

11. The method of claim 10 further comprising:
tracking, by at least one computer processor of the test and measurement system, at least one of the plurality of testing assets using at least a portion of the inventory information of the plurality of testing equipment on the network.

12. The method of claim 11 wherein the plurality of testing assets additionally includes one or more of: a bit error rate tester (BERT), an arbitrary waveform generator (AWG), an arbitrary function generator (AFG), a voltmeter, a DUT, a probe, and testing software.

13. The method of claim 11 further comprising:
determining, by at least one computer processor of the test and measurement system, usage patterns of the plurality of testing assets.

14. The method of claim 11 further comprising:
managing, by at least one computer processor of the test and measurement system, automatic software upgrades of the plurality of testing assets.

15. A test and measurement system comprising:
at least one memory; and
at least one processor coupled to the at least one memory, wherein the at least one memory has computer-executable instructions stored thereon that, when executed, cause the at least one processor to:
acquire, by a testing asset of the test and measurement system, a first waveform from a device under test (DUT) resulting from performing a first test on the DUT;
in response to acquiring the first waveform:
begin to analyze the first waveform; and
at least partially in parallel with analyzing the first waveform, begin to acquire, by the testing asset of the test and measurement system, a second waveform from the DUT resulting from performing a second test on the DUT; and
in response to acquiring the second waveform:
at least partially in parallel with analyzing the first waveform, begin to analyze the second waveform.

16. The system of claim 15 wherein the computer-executable instructions, when executed, further cause the at least one processor to acquire a subsequent waveform from the DUT resulting from performing a subsequent test on the DUT at least partially in parallel with analyzing a previous acquired waveform from the DUT resulting from performing a previous test on the DUT.

17. The system of claim 15 wherein the acquisition of waveforms includes:
acquiring the waveforms using an oscilloscope; and
storing the waveforms into a disaggregated persistent memory.

18. The system of claim 17 wherein the storing of the waveforms into a disaggregated persistent memory includes:
receiving, via an application programming interface (API), the waveforms from an acquisition engine that runs on the oscilloscope; and
storing the received waveforms in a database on a centralized data server remotely accessible to a system of a remote user.

19. The system of claim 15 wherein the analysis of waveforms includes performing, at least partially in parallel, respective analyses of the waveforms on a cloud computing system.

20. The system of claim 19 wherein the computer-executable instructions, when executed, further cause the at least one processor to:
automatically store, on the cloud computing system, results of the respective analyses of the waveforms; and
enable a remote user to access the results of the respective analyses of the waveforms stored on the cloud computing system.

21. A non-transitory computer-readable storage medium, having computer executable instructions stored thereon that, when executed by at least one processor, cause the at least one processor to:
acquire, by a testing asset of a test and measurement system, a first waveform from a device under test (DUT) resulting from performing a first test on the DUT;
in response to acquiring the first waveform:
begin to perform an analysis of the first waveform; and
at least partially in parallel with performing the analysis of the first waveform, begin to acquire, by the testing asset of the test and measurement system, a second waveform from the DUT resulting from performing a second test on the DUT; and
in response to acquiring the second waveform:
at least partially in parallel with performing the analysis of the first waveform, begin to perform an analysis of the second waveform.

22. The non-transitory computer-readable storage medium of claim 21, wherein
the testing asset of the test and measurement system comprises an oscilloscope.

23. The non-transitory computer-readable storage medium of claim 21, wherein the computer executable instructions, when executed by at least one processor, further cause the at least one processor to:
store, on a cloud computing system, equipment logs of testing equipment resulting from performing tests on the DUT; and
enable a remote user to access the equipment logs.

24. The non-transitory computer-readable storage medium of claim 21, wherein the performing the analysis of the second waveform at least partially in parallel with the performing the analysis of the first waveform includes:
instantiating, by a waveform analysis execution engine, in response to the acquisition of the second waveform, an instance of a waveform analysis application for the second waveform at least partially in parallel with executing a waveform analysis application for the first waveform, wherein the waveform analysis application for the first waveform was instantiated by the execution engine in response to the acquisition of the first waveform.

25. The non-transitory computer-readable storage medium of claim 24 wherein the waveform analysis application for the first waveform and the waveform analysis application for the second waveform are services which are enabled to execute independently on different computing systems located remotely from each other.

26. The non-transitory computer-readable storage medium of claim 24 wherein the waveform analysis execution engine is a service which executes independently and remotely on a different computing system than one or more computing systems on which the waveform analysis application for the first waveform and the waveform analysis application for the second waveform execute.

27. The non-transitory computer-readable storage medium of claim 22, wherein the computer executable instructions, when executed by at least one processor, further cause the at least one processor to:

cause, via an application programming interface (API), the first waveform and second waveform to be transferred from an acquisition engine of the oscilloscope to a database on a centralized data server remotely accessible to a system of a remote user, and communicate with the database on the centralized data server to perform the analysis of the second waveform at least partially in parallel with the performing the of analysis of the first waveform.

28. The non-transitory computer-readable storage medium of claim 27 wherein the analysis of the second waveform and the analysis of the first waveform are performed on a system remote from the centralized data server.

* * * * *